(12) United States Patent
Ueda et al.

(10) Patent No.: US 6,440,646 B2
(45) Date of Patent: Aug. 27, 2002

(54) POSITIVE RESIST COMPOSITION SUITABLE FOR LIFT-OFF TECHNIQUE AND PATTERN FORMING METHOD

(75) Inventors: Takafumi Ueda; Hideto Kato; Toshihiko Fujii; Miki Kobayashi, all of Usui-gun (JP)

(73) Assignee: Shin-Etsu Chemical Co., Ltd. (JP)

( * ) Notice: Subject to any disclaimer, the term of this patent is extended or adjusted under 35 U.S.C. 154(b) by 28 days.

(21) Appl. No.: 09/782,189

(22) Filed: Feb. 14, 2001

Related U.S. Application Data

(62) Division of application No. 09/459,876, filed on Dec. 14, 1999, now Pat. No. 6,210,855, which is a continuation of application No. 08/933,059, filed on Sep. 18, 1997, now abandoned.

(30) Foreign Application Priority Data

Sep. 19, 1996 (JP) ............................. 8-269217

(51) Int. Cl.⁷ ............................. G03F 7/30; G03F 7/023
(52) U.S. Cl. ...................... 430/324; 430/165; 430/190; 430/191; 430/192; 430/193; 430/329; 430/330
(58) Field of Search ................................ 430/329, 190, 430/191, 192, 193, 324, 330

(56) References Cited

U.S. PATENT DOCUMENTS

| | | | | | |
|---|---|---|---|---|---|
| 5,238,775 A | * | 8/1993 | Kajita et al. | ................ | 430/192 |
| 5,279,918 A | * | 1/1994 | Nishi et al. | ................ | 430/190 |
| 5,281,508 A | * | 1/1994 | Kohara et al. | ............... | 430/192 |
| 5,338,643 A | * | 8/1994 | Kanazawa et al. | .......... | 430/190 |
| 5,372,909 A | * | 12/1994 | Nishi et al. | ................ | 430/192 |
| 5,413,896 A | * | 5/1995 | Kajita et al. | ................ | 430/192 |
| 5,422,221 A | * | 6/1995 | Okazaki et al. | ............. | 430/190 |
| 5,478,691 A | * | 12/1995 | Miyashita et al. | .......... | 430/190 |
| 5,635,329 A | * | 6/1997 | Nishi et al. | ................ | 430/192 |
| 5,695,906 A | * | 12/1997 | Nishi et al. | ................ | 430/190 |
| 5,723,254 A | * | 3/1998 | Zampini et al. | ............. | 430/190 |
| 5,773,200 A | * | 6/1998 | Okazaki et al. | ............. | 430/324 |
| 5,925,502 A | * | 7/1999 | Vig et al. | ................... | 430/315 |

* cited by examiner

Primary Examiner—John S. Chu
(74) Attorney, Agent, or Firm—Millen, White, Zelano & Branigan, P.C.

(57) ABSTRACT

A positive resist composition contains (A) a novolak resin having a weight average molecular weight calculated as polystyrene of 2,000–20,000 wherein 2.5–27 mol % of the hydrogen atom of a hydroxyl group is replaced by a 1,2-naphthoquinonediazidosulfonyl group and (B) a low molecular aromatic compound having phenolic hydroxyl groups and 2–20 benzene rings wherein the ratio of the number of phenolic hydroxyl groups to the number of benzene rings is between 0.5 and 2.5. By forming a resist layer on a substrate from the positive resist composition and baking the resist layer at 90–130° C., followed by exposure and development, there is formed a resist pattern having an undercut of desired configuration. Owing to high resolution and improved dimensional control, heat resistance and film retention, the resist pattern lends itself to a lift-off technique.

20 Claims, 3 Drawing Sheets

(METAL LAYER SPUTTERING)

(RESIST PATTERNING)

(ETCHING)

(RESIST STRIPPING OFF)

(RESIST PATTERNING)

(METAL LAYER SPUTTERING)

(RESIST STRIPPING OFF)

POSITIVE RESIST COMPOSITION SUITABLE FOR LIFT-OFF TECHNIQUE AND PATTERN FORMING METHOD

This is a division of application Ser. No. 09/459,876 filed Dec. 14, 1999, now U.S. Pat. No. 6,210,855, which is a continuation of application Ser. No. 08/933,059, filed Sep. 18, 1997, now abandoned.

BACKGROUND OF THE INVENTION

1. Field of the Invention

This invention relates to a positive resist composition which lends itself to a lift-off technique.

2. Prior Art

In the prior art, dry and wet etching processes are commonly used in forming conductor patterns such as aluminum electrodes on semiconductor substrates. The process is illustrated in FIG. 3 as comprising metal layer sputtering and resist patterning to form a resist pattern 3 on a metallization layer 2 on a substrate 1. The exposed area of the metallization layer 2, that is, those metallization portions which are not covered with the resist pattern 3 are etched away. By treating the structure with a stripping solution, the resist pattern 3 is stripped off to leave a conductor pattern 2 on the substrate 1.

The above-mentioned process, however, suffers from low processing precision and a problem associated with etching procedure where difficult-to-etch metals such as gold and tantalum are used as the metallization. To avoid such inconvenience, a lift-off technique is often used in these years. The lift-off technique is illustrated in FIG. 4 as comprising resist patterning to form a resist pattern 3 on a substrate 1, metal sputtering to form a metal layer 2 on the resist pattern 3 and substrate 1, and processing the structure with a stripping solution to strip or lift off the resist. A conductor pattern can be formed without an etching procedure. This lift-off technique ensures precision processing since a metal pattern is formed using a precisely configured resist pattern as a template. Even a difficult-to-etch metal can be readily processed due to the eliminated need for etching as long as it can be deposited on the substrate and resist layer. The resist stripping step plays the most important role in the lift-off technique. If the resist can be effectively stripped in this step without leaving residues, the lift-off technique is expected to accomplish improvements in processing precision and reliability.

However, where patterns are formed by the lift-off technique using conventional positive resist compositions, the resist stripping step does not effectively take place and can leave resist residues, arising a problem of reliability.

Therefore, the lift-off technique often employs a step requiring complex, cumbersome operations, for example, a dual layer resist process and an image reversal resist process.

JP-A 69111/1996 (U.S. Ser. No. 573,578) discloses a resist material from which a pattern configuration suitable for the lift-off technique is obtained by a simple single-layer positive resist process. This resist material is epoch-making in that a pattern configuration suitable for the lift-off technique is obtained by an ordinary single-layer positive type one-step resist process while the resist material is prepared from three components, a novolak resin, a photosensitive agent, and a dissolution promoter. Then, in order to accomplish high resolution, dimensional control, heat resistance and film retention which are believed to be increasingly required in the future lift-off involving process, various contrivances concerning both the novolak resin and the photosensitive agent are necessary like conventional novolak base positive resist materials.

One exemplary measure associated with the novolak resin side is described. If a novolak resin is synthesized to a lower average molecular weight, the resulting resist layer is improved in resolution, but becomes poor in heat resistance and film retention. It then becomes necessary to take an appropriate measure of removing a low molecular weight novolak fraction as by subjecting the synthesized novolak resin to re-precipitation. The following measure is associated with the photosensitive agent side. As the light source of an aligner shifts from g-line to i-line, light is not easily transmitted by a resist layer containing a conventionally used benzophenone photosensitive agent. It then becomes necessary to take an appropriate measure of using a non-benzophenone photosensitive agent causing less absorption of i-line.

However, in order that a resist material for the lift-off technique having higher resolution as well as satisfactory dimensional control, heat resistance, and film retention be accomplished by combining such measures, many additional steps are necessary in the resist preparation process and undesirably cause a cost increase.

Therefore, an object of the present invention is to provide a positive resist composition for use in the lift-off technique which has solved the above-mentioned problems of the lift-off technique, which can form a reliable conductor pattern at high processing precision, which is sufficiently heat resistant to withstand the elevated temperature encountered upon metal sputtering, and which can be prepared by a simple process. Another object of the present invention is to provide a method for forming a wiring or conductor pattern using the resist composition according to the lift-off technique.

Although the lift-off technique generally needs complex steps using a dual-layer resist or image reversal resist, the invention intends to provide a positive resist composition from which a resist pattern having high working precision and reliability and amenable to the lift-off technique can be formed through a single-layer positive type one-step resist process. The resultant resist pattern has sufficient heat resistance to withstand the heat encountered upon metal sputtering, can be formed by simple steps, and can be advantageously used in forming a wiring pattern such as an electrode of a difficult-to-etch metal.

SUMMARY OF THE INVENTION

In search of a resist composition for use in the lift-off technique which has solved the above-mentioned problems of the prior art and has the advantages of high resolution, dimensional control, heat resistance and film retention, we have found that by blending (A) a 1,2-naphthoquinonediazidosulfonyl-introduced novolak resin containing at least one recurring unit of the following general formula (1) and having a weight average molecular weight calculated as polystyrene of 2,000 to 20,000, 2.5 to 27 mol % of the hydrogen atom of a hydroxyl group in the novolak resin being replaced by a 1,2-naphthoquinonediazidosulfonyl group, with (B) a low molecular aromatic compound having phenolic hydroxyl groups and 2 to 20 benzene rings, the ratio of the number of phenolic hydroxyl groups to the number of benzene rings being from 0.5 to 2.5, the low molecular aromatic compound being represented by the following general formula (2) or (3), to thereby form a positive resist composition, applying the resist composition onto a substrate to thereby form a resist layer, preferably baking the resist layer at a temperature of 90 to 130° C. before exposure or development, and effecting exposure and development, there can be formed a resist pattern which has an undercut of desired configuration and is sufficiently improved in resolution, dimensional control, heat resistance and film retention to lend itself to the lift-off technique.

(1)
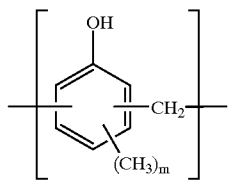

In formula (1), m is an integer of 0 to 3.

(2)
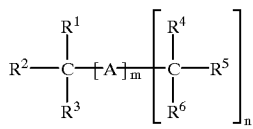

(3)
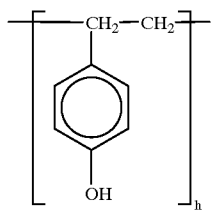

In formula (2), m is an integer of 0 to 2, n is an integer of 0 to 2, with the proviso that m is equal to 1 or 2 when n is equal to 0. $R^1$ to $R^6$ are independently a hydrogen atom, a methyl group, a group of the following formula (4) or a group of the following formula (5). A is hydrogen, methyl or a group of the following formula (4) when n is 0 and m is 1; one A is methylene or a group of the following formula (6) and the other A is hydrogen, methyl or a group of the following formula (4) when n is 0 and m is 2; A is methylene or a group of the following formula (6) when n is 1; A is methine or a group of the following formula (7) when n is 2 and m is 1; and one A is methylene or a group of the following formula (6) and the other A is methine or a group of the following formula (7) when n is 2 and m is 2.

In formula (3), h is a sufficient number to give a weight average molecular weight of 200 to 2,500.

(4)
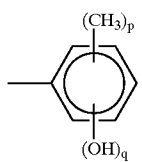

(5)
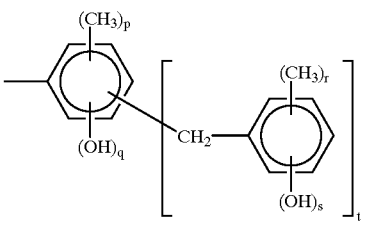

(6)
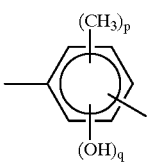

(7)
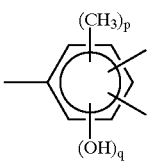

In formulae (4) to (7), p, q, r, s, and t each are an integer of 0 to 3.

More particularly, in the resist composition amenable to the lift-off technique according to the invention, the novolak resin having a photosensitive agent integrated therewith maintains a low average molecular weight and high resolution until exposure, but converts into a higher molecular weight one after development because the novolak resin undergoes crosslinking reaction through azo-coupling reaction during development. As a result, the pattern formed from the resist composition has very high heat resistance. Therefore, the invention ensures high resolution and heat resistance at the same time.

Since the matrix of the photosensitive agent is a novolak resin itself according to the invention, it is unnecessary to change the photosensitive agent even when the wavelength changes with different light sources. Then not only a resist composition featuring high resolution and heat resistance can be produced through simple steps at low cost, but also a universal resist composition is available independent of the wavelength of the light source of various aligners.

Additionally, since the composition of the invention consists essentially of two components, (A) an integrated resin serving as an alkali-soluble resin and a photo-sensitive agent and (B) a dissolution promoter, baking before or after exposure is likely to induce segregation of the dissolution promoter in proximity to the substrate. Then an undercut of desired configuration and dimensions suitable for use in the lift-off technique can be developed in the resist pattern as desired.

Therefore, according to the invention, a resist pattern having an undercut of desired configuration suitable for use in the lift-off technique and featuring high resolution, heat resistance and dimensional stability can be formed, whereby a wiring pattern featuring high processing precision and reliability can be formed by the lift-off technique.

Accordingly, in a first aspect, the present invention provides a positive resist composition for use in the lift-off technique comprising in admixture, (A) a 1,2-naphthoquinonediazidosulfonyl-introduced novolak resin containing at least one recurring unit of the general formula (1) and having a weight average molecular weight calculated as polystyrene of 2,000 to 20,000, 2.5 to 27 mol % of the hydrogen atom of a hydroxyl group in the novolak resin being replaced by a 1,2-naphthoquinonediazidosulfonyl group, and (B) a low molecular aromatic compound of the general formula (2) or (3) having phenolic hydroxyl groups and 2 to 20 benzene rings, the ratio of the number of phenolic hydroxyl groups to the number of benzene rings being from 0.5 to 2.5.

In a second aspect, the present invention provides a method for forming a pattern comprising the steps of:

forming a resist layer on one surface of a substrate, processing the resist layer to form a resist pattern, metallizing the substrate surface including the resist pattern, and stripping off the resist pattern to leave a pattern of metallization on the substrate, wherein the resist layer constituting said resist pattern is formed with an undercut.

Preferably, in a profile of said resist layer constituting said resist pattern as shown in FIGS. 1 and 2 wherein the resist layer has a line width of L μm and a thickness of T μm, and the undercut has a cut height of A μm and a cut depth of B μm, the resist layer has a thickness T of up to 20 μm and the undercut has an extent of cut defined by the equations (I) and (II):

$$1/20 \leq A/T \leq 2/5 \qquad (I)$$

$$1/20 \leq A/B \leq 4 \qquad (II).$$

Preferably, the resist layer is constructed of the positive resist composition of the first aspect.

More preferably, the steps of forming a resist layer on one surface of a substrate and processing the resist layer to form a resist pattern include forming a resist layer on one surface of a substrate from the positive resist composition of the first aspect, baking the resist layer at a temperature of 90 to 130° C. before exposure or before development, exposing the resist layer to light, developing the resist layer, thereby forming an undercut in the resist layer.

BEST MODE FOR CARRYING OUT THE INVENTION

Figure 1:
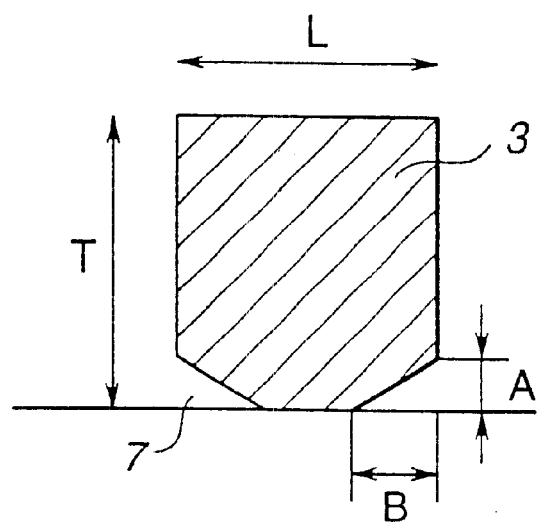
FIG. 1 is a schematic cross-section of one exemplary resist layer having an undercut formed therein.

According to the first aspect of the present invention, the positive resist composition which lends itself to the lift-off technique uses (A) a novolak resin containing at least one recurring unit of the following general formula (1):

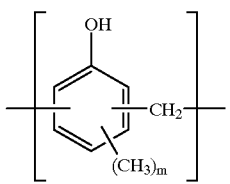

wherein m is an integer of 0 to 3 and having a weight average molecular weight calculated as polystyrene of 2,000 to 20,000. The hydrogen atom of a hydroxyl group in the novolak resin is replaced by a 1,2-naphthoquinonediazidosulfonyl group in an amount of 2.5 to 27 mol %. Therefore, the novolak resin (A) is a 1,2-naphthoquinonediazidosulfonyl-introduced novolak resin.

The novolak resins having a recurring unit of formula (1) can be synthesized by condensing at least one phenol of the following general formula (1a):

(1a)

OH (CH₃)ₘ wherein m is an integer of 0 to 3, typically o-cresol, m-cresol, p-cresol, and 3,5-xylenol with an aldehyde in a conventional manner. Examples of the aldehyde include formaldehyde, para-formaldehyde, acetaldehyde, and benzaldehyde, with formaldehyde being preferred. The phenol of formula (1a) and the aldehyde are preferably used in a molar ratio between 0.2 and 2, especially between 0.3 and 2.

With respect to the average molecular weight of the novolak resin of formula (1), it has a weight average molecular weight calculated as polystyrene of 2,000 to 20,000, especially 3,000 to 10,000. With a weight average molecular weight of less than 2,000, a resist film has heat resistance below the practically acceptable level. With a weight average molecular weight of more than 20,000, a resist film becomes low in resolving power.

According to the invention, the novolak resin whose hydroxyl group is partially replaced by a 1,2-naphthoquinonediazidosulfonyl group is used as a base component.

The 1,2-naphthoquinonediazidosulfonyl group is preferably introduced into the novolak resin by a partial esterification method using a 1,2-naphthoquinonediazide compound. Exemplary 1,2-naphthoquinonediazide compounds are 1,2-naphthoquinonediazido-4-sulfonates and 1,2-naphthoquinonediazido-5-sulfonates. The proportion of the hydrogen atom of a hydroxyl group in the novolak resin replaced by a 1,2-naphthoquinonediazidosulfonyl group is 2.5 to 27 mol %, preferably 3 to 20 mol %. With a percent esterification of less than 2.5 mol %, film retention is poor and a resist composition cannot be configured to a pattern and ceases to be useful. A novolak resin with a percent esterification of more than 27 mol % is less soluble in solvents such as ethyl cellosolve acetate, and a resist composition can not be prepared therefrom. It is noted that the partial esterification with the 1,2-naphthoquinonediazide compound can be performed by conventional methods known for partial esterification.

Blended as a dissolution promoter is (B) a low molecular aromatic compound having phenolic hydroxyl groups and 2 to 20 benzene rings wherein the ratio of the number of phenolic hydroxyl groups to the number of benzene rings is between 1/2 and 5/2. The low molecular aromatic compound is of the following general formula (2) or (3).

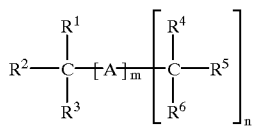
(2)

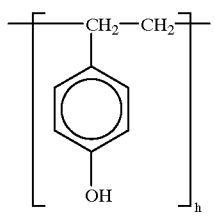
(3)

In formula (2), m is an integer of 0 to 2, n is an integer of 0 to 2, with the proviso that m is equal to 1 or 2 when n is equal to 0. $R^1$ to $R^6$ are independently a hydrogen atom, a methyl group, a group of the following formula (4) or a group of the following formula (5). A varies with a combination of m and n. A is hydrogen, methyl or a group of the following formula (4) when n is 0 and m is 1. One A is methylene or a group of the following formula (6) and the other A is hydrogen, methyl or a group of the following formula (4) when n is 0 and m is 2. A is methylene or a group of the following formula (6) when n is 1. A is methine or a group of the following formula (7) when n is 2 and m is 1. One A is methylene or a group of the following formula (6) and the other A is methine or a group of the following formula (7) when n is 2 and m is 2.

In formula (3), h is a sufficient number to give a weight average molecular weight of 200 to 2,500.

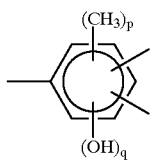
(4)

(5)

(6)

(7)

wherein p, q, r, s, and t each are an integer of 0 to 3.

More specifically, the low molecular aromatic compound of formula (2) or (3) has phenolic hydroxyl groups and 2 to 20 benzene rings, preferably 3 to 10 benzene rings wherein the ratio of the number of phenolic hydroxyl groups to the number of benzene rings is between 0.5 and 2.5, preferably between 0.7 and 2.0. If the number ratio of phenolic hydroxyl groups to benzene rings is less than 0.5, the rate of dissolution in an alkaline developer becomes lower so that the compound may not serve as a dissolution promoter. If the number ratio of phenolic hydroxyl groups to benzene rings is more than 2.5, the rate of dissolution in an alkaline developer increases to such an extent as to induce a pattern flow.

The low molecular aromatic compound has a weight average molecular weight of 200 to 2,500, preferably 300 to 2,000. With a weight average molecular weight of less than 200, a resist film becomes extremely poor in heat resistance. A weight average molecular weight of more than 2,500 would hinder the appearance of undercuts and cause scumming.

Illustrative, non-limiting examples of the low molecular aromatic compound are given below.

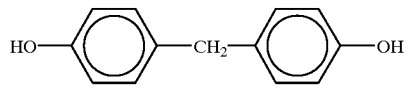
(C-1)

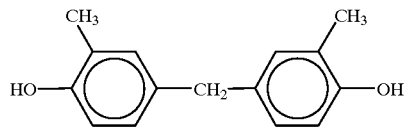
(C-2)

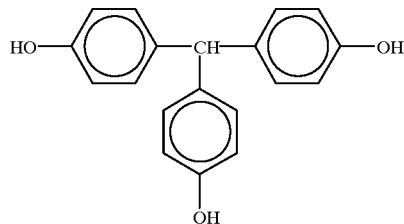
(C-3)

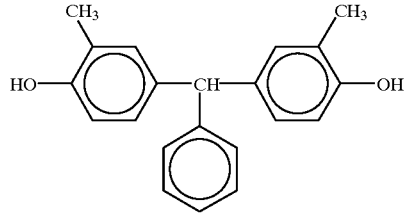
(C-4)

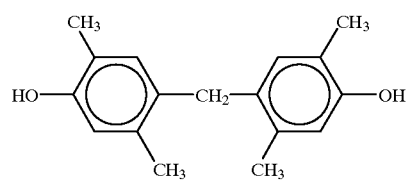
(C-5)
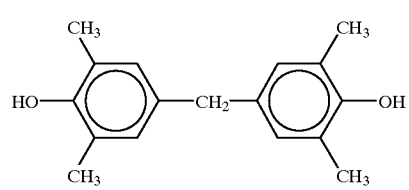
(C-6)
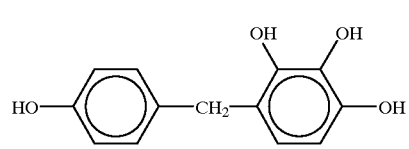
(C-7)
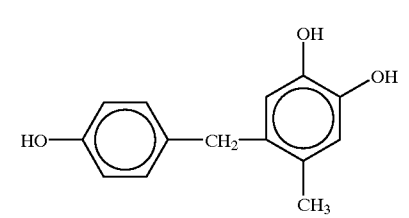
(C-8)
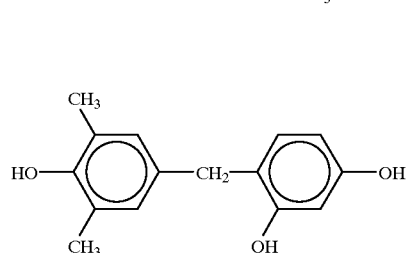
(C-9)
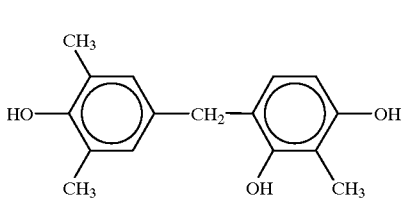
(C-10)
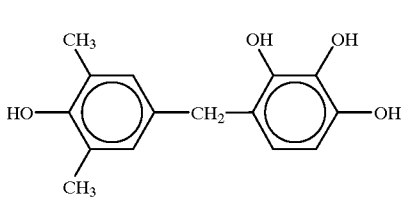
(C-11)
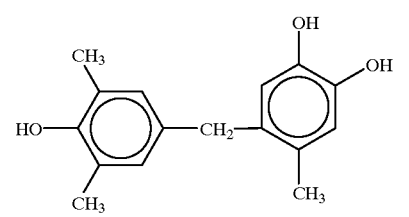
(C-12)
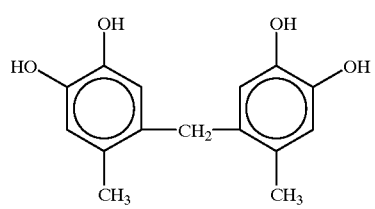
(C-13)
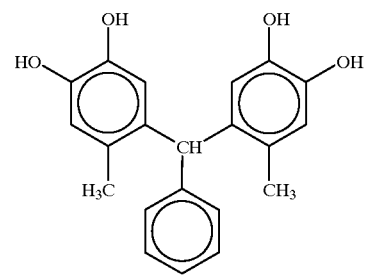
(C-14)
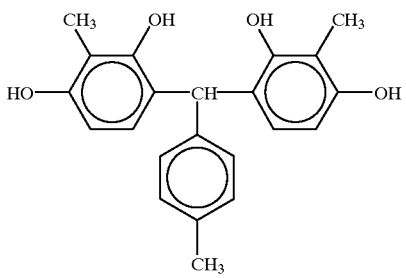
(C-15)
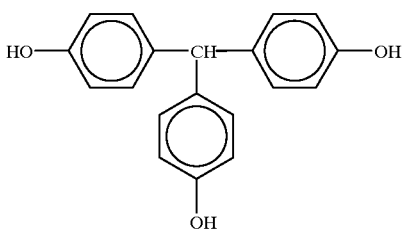
(C-16)
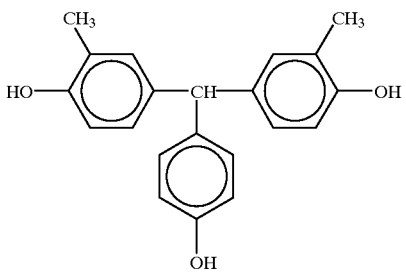
(C-17)
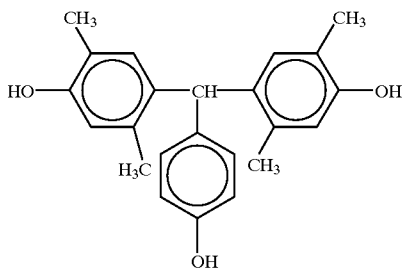
(C-18)

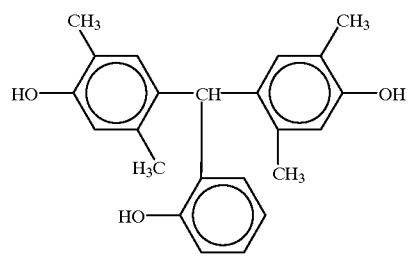
(C-19)
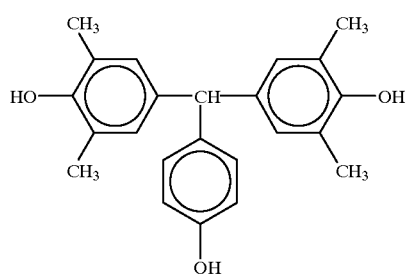
(C-20)
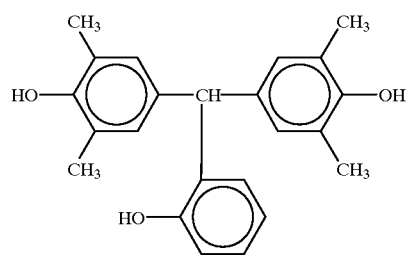
(C-21)
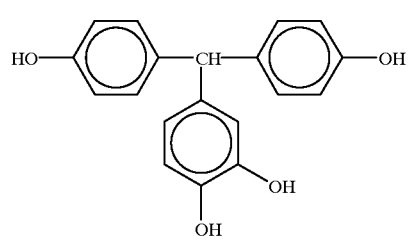
(C-22)
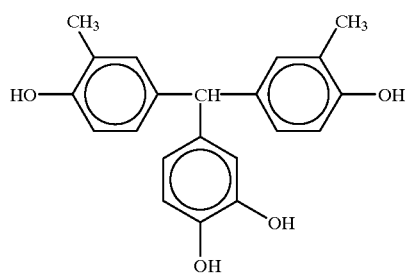
(C-23)
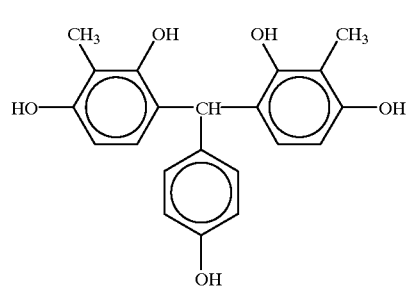
(C-24)
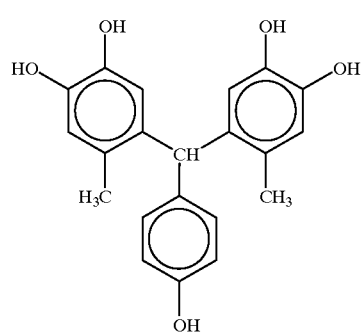
(C-25)
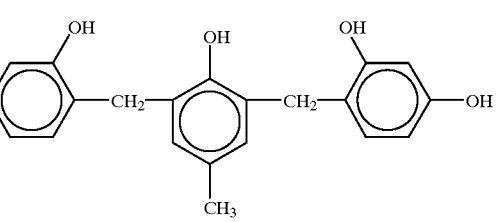
(C-26)
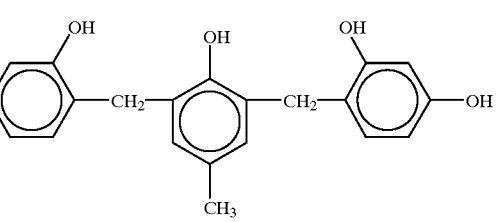
(C-27)
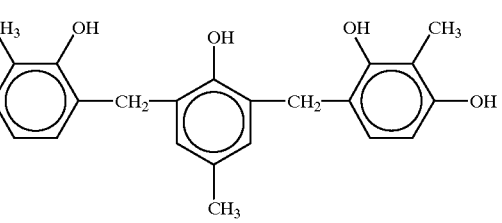
(C-28)
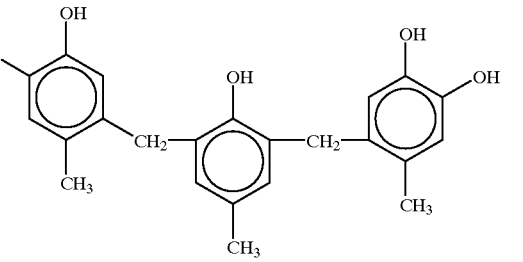
(C-29)

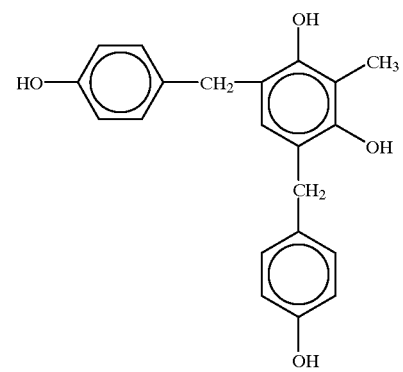
(C-30)
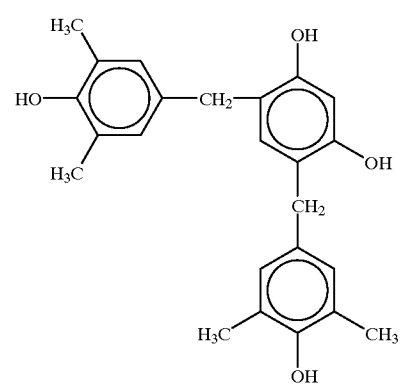
(C-31)
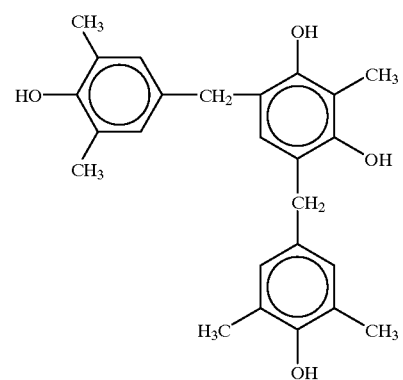
(C-32)
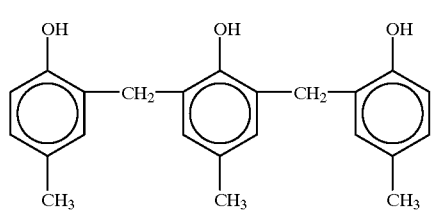
(C-33)
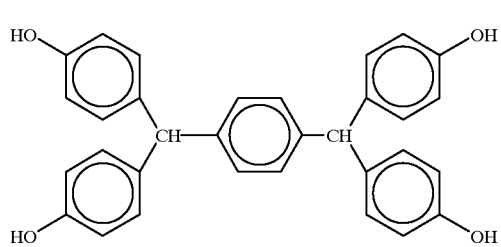
(C-34)
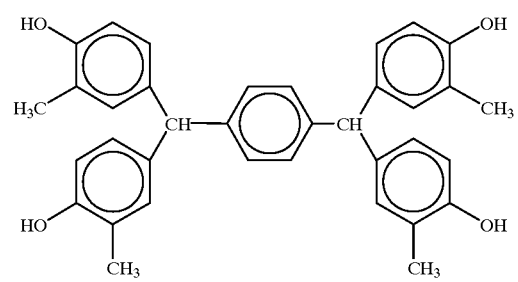
(C-35)
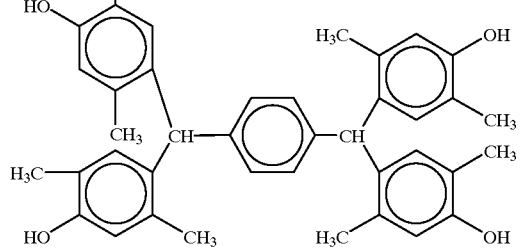
(C-36)
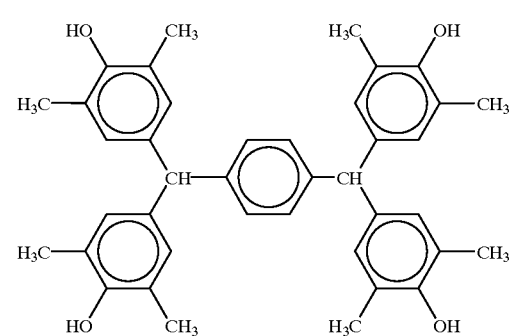
(C-37)
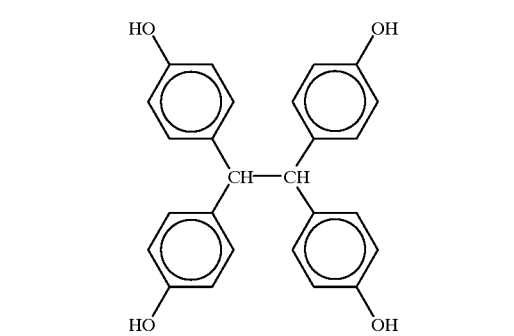
(C-38)
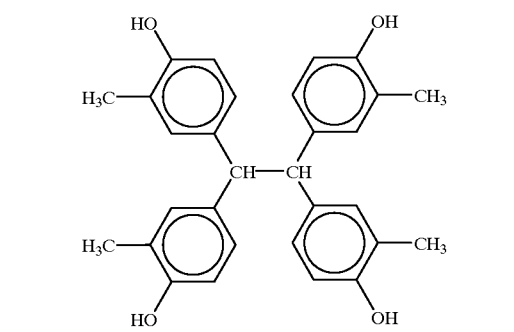
(C-39)

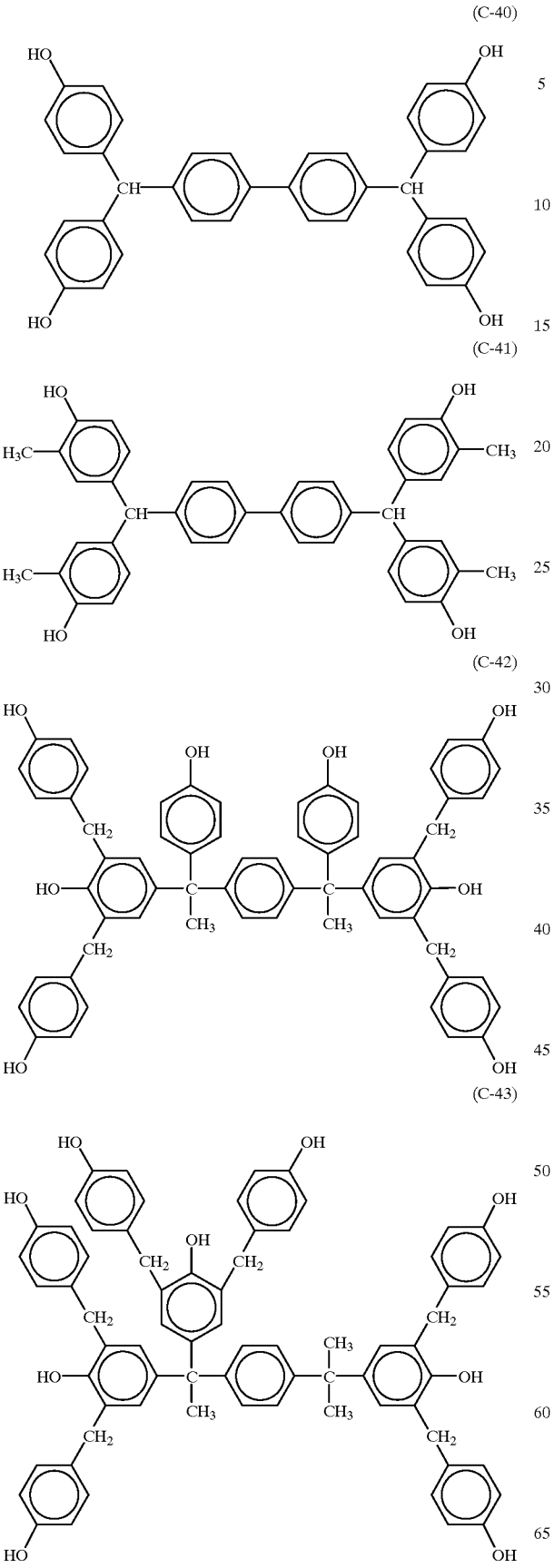
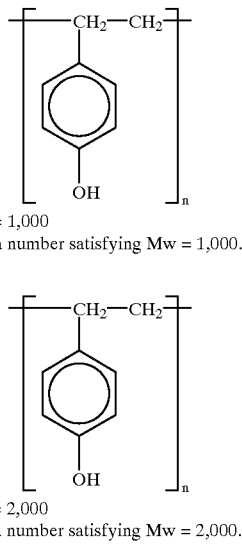

The positive resist composition of the invention is preferably a blend of 100 parts by weight of (A) 1,2-naphthoquinonediazidosulfonyl-introduced novolak resin and 1 to 60 parts by weight, more preferably 2 to 40 parts by weight of (B) dissolution promoter. If the amount of the dissolution promoter is less than 1 part, the appearance of an undercut would be hindered. If the amount of the dissolution promoter is more than 60 parts, the effect of inhibiting dissolution of unexposed areas in an alkaline developer would become insufficient, permitting the pattern to be dissolved away.

Although the positive resist composition of the invention uses the 1,2-naphthoquinonediazidosulfonyl-substituted novolak resin (A) as a film-forming resin and photosensitive agent and the dissolution promoter (B) for generating undercuts as mentioned above, various additives such as dyes, pigments and surfactants may be added to the composition. If desired, another photosensitive agent is blended therein.

The surfactant used herein includes nonionic, fluorinated and silicone surfactants. The amount of the surfactant added is preferably less than 2 parts by weight per 100 parts by weight of the 1,2-naphthoquinonediazidosulfonyl-substituted novolak resin (A).

The composition of the invention may be prepared by dissolving the 1,2-naphthoquinonediazidosulfonyl-substituted novolak resin (A) and the dissolution promoter (B) in a suitable solvent in a solids concentration of 10 to 60% by weight and optionally blending various additives. The solvent used herein is typically and most preferably ethyl cellosolve acetate (ECA) although other useful solvents include ethylene glycol monoalkyl ethers and acetates thereof, propylene glycol monoalkyl ethers and acetates thereof, diethylene glycol mono- or di-alkyl ethers, alkyl lactates, alkyl alkoxypropionates, ketones such as methyl ethyl ketone, methyl isobutyl ketone, and cyclohexanone, and acetate esters such as butyl acetate. These solvents may be used alone or in admixture of two or more.

The resist composition of the invention can be prepared by a conventional procedure, for example, by dissolving the above-mentioned components to an appropriate concentration to provide a desired film thickness by spin coating and passing the solution through a filter having a pore size of about 0.1 to 0.2 $\mu$m.

The present invention is also directed to a method for forming a metal pattern by the lift-off technique. A resist film is formed on one surface of a substrate from an appropriate resist composition, followed by exposure and development to form a predetermined resist pattern. A metallization layer of gold, tantalum or the like is then formed on the substrate surface (that is, on the resist pattern and that surface of the substrate where no resist pattern is formed) by suitable means such as evaporation and sputtering. An appropriate stripping solution is then applied to strip off the resist pattern, obtaining a predetermined metal pattern on the substrate. According to the feature of the invention, the resist layer constituting the resist pattern is formed with an undercut. Then the metallization layer is formed on the undercut resist pattern, which is subsequently stripped off.

Figure 2:
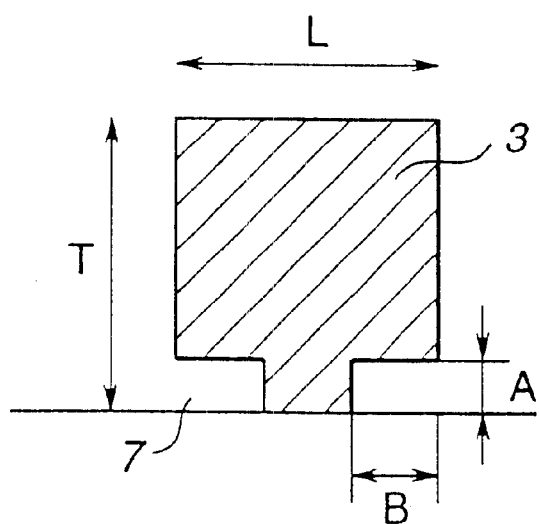
FIG. 2 is a schematic cross-section of another exemplary resist layer having an undercut formed therein.
Figure 3:
FIG. 3 schematically illustrates an etching process.
Figure 3:
Figure 3:
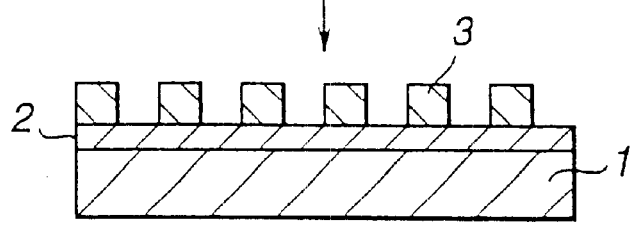
Figure 3:
Figure 3:
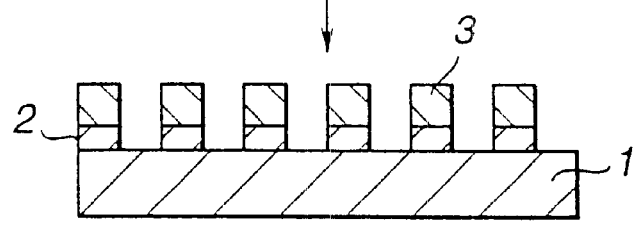
Figure 3:
Figure 3:
Figure 4:
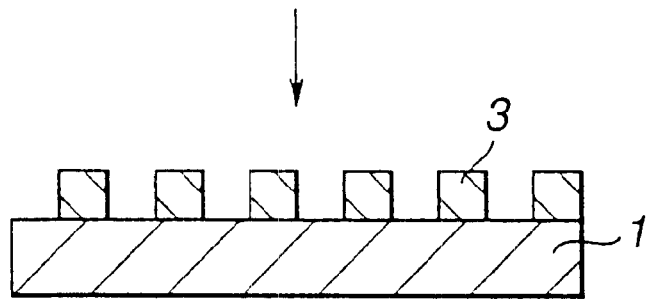
FIG. 4 schematically illustrates a resist pattern forming process by a lift-off technique.
Figure 4:
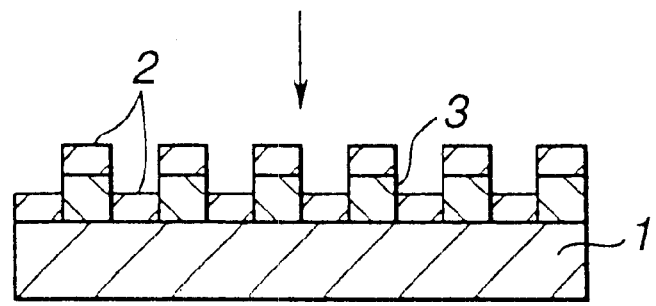
Figure 4:
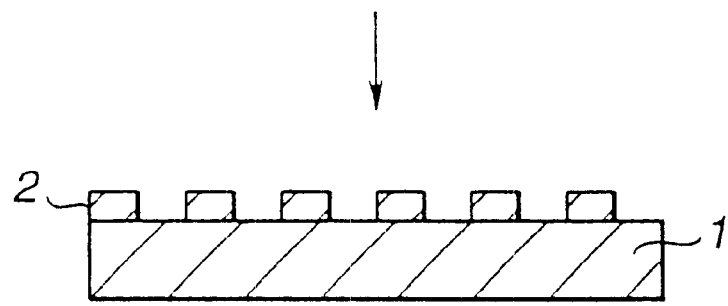

The undercut is configured to a rectangular or triangular groove geometry as shown in FIGS. 1 and 2. The dimensions of the undercut are as follows. In a profile of the resist layer constituting the resist pattern as shown in FIGS. 1 and 2, the resist layer has a line width of $L\,\mu m$ and a thickness of $T\,\mu m$, and the undercut 4 has a cut height of $A\,\mu m$ and a cut depth of $B\,\mu m$. In one preferred embodiment, the resist layer has a thickness T of up to 20 $\mu m$ and the undercut has an extent of undercut defined by the equations:

$$1/20 \leq A/T \leq 2/5 \text{ and } 1/20 \leq A/B \leq 4,$$

more preferably $$1/10 \leq A/T \leq 1/5 \text{ and } 1/5 \leq A/B \leq 1.$$

If A/T is less than 1/20, a less undercut would render ineffective the stripping step in the lift-off technique. If A/T is more than 2/5, the resist pattern would be broken from the root and flow away. If A/B is less than 1/20, the resist pattern would be less adhesive to the substrate and readily flow away. If A/B is more than 4, the metal would deposit into the undercut to render difficult the resist stripping after metallization.

The resist composition used in this process is any desired one as long as undercuts as defined above can be formed in the resist layer. Of course, the positive resist composition according to the first aspect of the present invention is best suited for this process.

In using the positive resist composition according to the invention, it is effective to bake the resist film at a temperature of 90 to 130° C. before exposure or before development or both. The baking step ensures more effective formation of undercuts. The baking step may be done as a pre-baking step and/or a post-exposure baking step. If the baking temperature is lower than 90° C., no undercuts would be formed. Baking temperatures above 130° C. would render resist stripping difficult. The preferred baking temperature is 100 to 120° C.

For exposure, i-line (365 nm), h-line (405 nm), g-line (436 nm), and broad band radiation are preferably used. For development, aqueous solutions of organic bases such as tetramethylammonium hydroxide and aqueous solutions of inorganic bases such as sodium hydroxide, potassium hydroxide and potassium metaborate are useful.

There has been described a lift-off technique amenable positive resist composition which can form a resist pattern in the form of a resist layer having an undercut of predetermined configuration through a single-layer positive type one-step process, the resist pattern featuring high resolution and improved dimensional control, heat resistance and film retention and thus being amenable to the lift-off technique.

EXAMPLE

Examples of the present invention are given below by way of illustration and not by way of limitation. All parts are by weight.

In each example, the resist was evaluated by the following tests.

(1) Weight average molecular weight Mw of alkali-soluble resin

It was measured by gel permeation chromatography using a GPC column set (two G2000H6, three G3000H6, and one G4000H6 column, manufactured by Toyo Soda K.K.) and mono-disperse polystyrene as the standard under the conditions: a flow rate of 1.5 ml/min., an eluting solvent tetrahydrofuran, and a column temperature of 40° C.

(2) Alkali solubility of alkali-soluble resin

An alkali-soluble resin was dissolved in ethyl cellosolve acetate (ECA) solvent to a solids content of 25%. The solution was coated onto a 6-inch silicon wafer at 3,000 rpm and softly baked on a hot plate at 90° C. for 90 seconds, obtaining a resin film of about 1.5 $\mu m$ thick. The film was set in a development process monitor model PMS-601 (manufactured by Dai-Nihon Screen K.K.) where it was developed with 2.38% tetramethylammonium hydroxide (TMAH) and the time taken until the residual film became zero was measured. The alkali solubility is determined by dividing the initial film thickness by the film extinguish time and expressed in angstrom/second (Å/sec.). If the alkali solubility is too low, the alkali solubility is the difference between the initial film thickness and the film thickness after 1,000-second development divided by 1,000 seconds.

(3) Degree of esterification

An OH equivalent is defined as the molecular weight of the novolak resin of formula (1) per phenolic OH group (which is given by dividing the molecular weight of the novolak resin by the number of OH groups in a molecule). The proportion of 1,2-quinonediazidosulfonyl group introduced therein is calculated from the moles of the initial charge.

(4) Resist film thickness

Using a spin coater Model SKW-636-BV (manufactured by Dai-Nihon Screen K.K.), a resist composition was coated on a HMDS-treated silicon wafer. The resist film was softly baked on a hot plate at 90° C. for 90 seconds and then measured for thickness by means of an optical film gage available under the tradename: Nanospec M210.

(5) Optimum exposure Eop

A resist composition was coated on a 6-inch silicon wafer by means of a coater and softly baked on a hot plate at 90° C. for 90 seconds to form a resist film of 1.5 $\mu m$ thick. Exposure was made on the resist film by means of an i-line (365 nm) stepper model NSR-1755i7A (manufactured by Nikon K.K., lens numerical aperture NA=0.50) while varying the exposure dose. The resist was subject to post-exposure baking (PEB) on a hot plate at 110° C. for 90 seconds and then to paddle development at 23° C. for 65 seconds using an aqueous solution of 2.38% tetramethylammonium hydroxide (TMAH) as a developer, rinsed with pure water, and spin dried. The optimum exposure Eop is defined as the exposure dose required to form a 5-$\mu m$ line-and-space pattern in a width ratio of 1:1 as observed under an electron microscope model S-4100 (manufactured by Hitachi K.K.).

(6) Heat resistance

A resist film which had been patterned as above was further heated on a hot plate at 130° C. for 5 minutes. Heat resistance was judged by observing whether or not the shape of the 5-$\mu m$ line-and-space pattern was maintained after heating.

Synthesis Examples 1–5
Synthesis of Alkali-Soluble Resins

A three-necked flask equipped with a stirrer, condenser and thermometer was charged with 64.8 g (0.6mol) of p-cresol, 162.3 g (1.50 mol) of m-cresol, 110.1 g (0.90 mol) of 3,5-xylenol, 133.8 g (1.65 mol) of an aqueous solution of 37 wt % formaldehyde, and 0.90 g ($7.2 \times 10^{-3}$ mol) of oxalic acid dihydrate as a polycondensation catalyst. The flask was immersed in an oil bath to maintain an internal temperature of 100° C. and polycondensation reaction took place for one hour.

At the end of reaction, 1,500 ml of methyl isobutyl ketone (MIBK) was added to the reaction solution which was stirred for 30 minutes. The aqueous layer was separated off. The MIBK layer in which the product was extracted was washed 5 times with 900 ml of pure water, followed by separation and vacuum stripping by means of an evaporator at 4 mmHg and 150° C. As a result, 245 g of a novolak resin A-1 was prepared.

Like novolak resin A-1, novolak resins A-2 through A-5 were synthesized using a phenol and formaldehyde as shown in Table 1.

TABLE 1

| Synthesis example | Novolak resin | p-cresol (mol %) | m-cresol (mol %) | 3,5-xylenol (mol %) | Mw | Alkali dissolution rate (Å/sec.) | OH equivalent |
| --- | --- | --- | --- | --- | --- | --- | --- |
| 1 | A-1 | 20 | 50 | 30 | 6,000 | 200 | 124.4 |
| 2 | A-2 | 25 | 55 | 20 | 4,500 | 300 | 123.0 |
| 3 | A-3 | 60 | 40 | — | 3,000 | 800 | 120.2 |
| 4 | A-4 | 20 | 50 | 30 | 8,000 | 50 | 124.4 |
| 5 | A-5 | 25 | 55 | 20 | 25,000 | 3 | 123.0 |

Synthesis Examples 6–15

Synthesis of 1,2-Naphthoquinonediazidosulfonyl-Introduced Novolak Resins

Under a light-shielded condition, a three-necked flask equipped with a stirrer, dropping funnel and thermometer was charged with 150 g (1.2 mol) of novolak resin A-1 (OH equivalent 124.4), 19.3 g (0.072 mol) of 1,2-naphthoquinone-2-diazido-5-sulfonyl chloride, and 760 g of 1,4-dioxane. At room temperature, 8.0 g (0.079 mol) of triethylamine was added dropwise to the solution. After the dropwise addition, stirring was continued for 10 hours. The reaction solution was poured into a large volume of a 0.12N hydrochloric acid solution whereupon the resin precipitated. The resin was prepared, dissolved in 600 g of ethyl acetate, and washed three times with 200 g of water. Separation and vacuum stripping at 40° C. yielded 140 g of 1,2-naphthoquinone-2-diazido-5-sulfonyl-introduced novolak resin B-1.

As shown in Table 2, novolak resins B-2 through B-10 having a 1,2-naphthoquinone-2-diazido-4-sulfonyl group (NQD-4) or 1,2-naphthoquinone-2-diazido-5-sulfonyl group (NQD-5) introduced therein were similarly obtained using raw materials as shown in Table 2.

TABLE 2

| Synthesis Example | NQD-introduced novolak resin | Starting novolak resin Type | Mw | NQD introduced (mol %) | Type of NQD introduced |
| --- | --- | --- | --- | --- | --- |
| 6 | B-1 | A-1 | 6,000 | 6 | NQD-5 |
| 7 | B-2 | A-1 | 6,000 | 3 | NQD-5 |
| 8 | B-3 | A-2 | 4,500 | 10 | NQD-5 |
| 9 | B-4 | A-2 | 4,500 | 15 | NQD-4 |
| 10 | B-5 | A-3 | 3,000 | 25 | NQD-5 |

TABLE 2-continued

| Synthesis Example | NQD-introduced novolak resin | Starting novolak resin Type | Mw | NQD introduced (mol %) | Type of NQD introduced |
| --- | --- | --- | --- | --- | --- |
| 11 | B-6 | A-4 | 8,000 | 6 | NQD-5 |
| 12 | B-7 | A-4 | 8,000 | 10 | NQD-4 |
| 13 | B-8 | A-1 | 6,000 | 1 | NQD-5 |
| 14 | B-9 | A-3 | 3,000 | 30 | NQD-5 |
| 15 | B-10 | A-5 | 25,000 | 10 | NQD-5 |

NQD: 1,2-naphthoquinonediazidosulfonyl

Synthesis Example 16

Synthesis of 1,2-Quinonediazide Compound

Under a light-shielded condition, a three-necked flask equipped with a stirrer, dropping funnel and thermometer was charged with 10.0 g (43.4 mol) of 2,3,4-trihydroxybenzophenone, 35.0 g (130 mol) of 1,2-naphthoquinone-2-diazido-5-sulfonyl chloride, and 200 g of 1,4-dioxane. The flask was immersed in a water bath to control its temperature below 25° C. To the flask, a solution of 10.50 g of 1,4-diazabicyclo[2.2.2]octane (DABCO) in 100 g of 1,4-dioxane as a catalyst was added dropwise through the dropping funnel. The precipitated DABCO hydrochloride salt was removed by filtration and with stirring, the filtrate was added dropwise to 1,800 g of 0.12N hydrochloric acid for re-precipitation. The solution was subject to filtration again. The precipitate was extracted with 300 ml of ethyl acetate, washed 5 times with 100 g of pure water and separated. Vacuum stripping by means of an evaporator below 40° C. yielded 41.0 g of a 1,2-quinonediazide compound D-1 represented by the following formula and having an esterification factor of 100%.

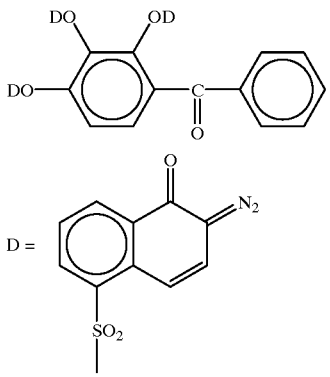

(D-1)

Examples 1–10

A positive resist composition in solution form was prepared by adding a dissolution promoter and solvent to 100 parts of a novolak resin having a 1,2-naphthoquinone-2-diazidosulfonyl group partially introduced therein as shown in Table 3, further adding 0.3% based on the solvent of a fluorinated surfactant, Fluorinate FC430 (Sumitomo 3M K.K.) thereto, mixing them to form a homogeneous solution, and passing the solution through a 0.2-$\mu$m membrane filter. Note that the structural formula of dissolution promoters used is previously shown in the list of compounds C-1 to C-45.

The resist solution was spin coated onto a 6-inch silicon wafer and softly baked on a hot plate at 90° C. for 90 seconds to form a resist film of 1.5 $\mu$m thick. The resist film was then exposed to radiation (i-line) at wavelength 365 nm through a reticle, subjected to post-exposure baking (PEB) at 110° C. for 90 seconds, developed with 2.38% TMAH, rinsed with pure water, and dried.

The resulting resist was evaluated for various properties by the above-mentioned tests. A profile of 5-$\mu$m line-and-space pattern was evaluated in terms of cut dimensions (height A and depth B) of an undercut as shown in FIGS. 1 and 2. The results are shown in Table 3.

TABLE 3

| Example | NQD-introduced novolak resin Type | Amount (pbw) | Dissolution promoter Type | Amount (pbw) | Solvent Type | Amount (pbw) | Eop (mJ/cm$^2$) | Cut dimensions A ($\mu$m) | B ($\mu$m) |
|---|---|---|---|---|---|---|---|---|---|
| 1 | B-1 | 100 | C-34 | 35 | ECA | 380 | 100 | 0 | 1.0 |
| 2 | B-1 | 100 | C-2 | 5 | EL | 360 | 400 | 0.3 | 0.3 |
| 3 | B-1 | 100 | C-45 | 35 | ECA | 380 | 400 | 0.5 | 0.4 |
| 4 | B-2 | 100 | C-29 | 30 | ECA | 380 | 220 | 0.3 | 0.8 |
| 5 | B-3 | 100 | C-34 | 25 | EL | 370 | 100 | 0.4 | 0.5 |
| 6 | B-4 | 100 | C-34 | 35 | ECA | 350 | 200 | 0.3 | 1.2 |
| 7 | B-5 | 100 | C-29 | 35 | PGMEA | 350 | 260 | 0.3 | 1.0 |
| 8 | B-6 | 100 | C-2 | 15 | MMP | 360 | 600 | 0.3 | 1.5 |
| 9 | B-7 | 100 | C-43 | 40 | MMP | 360 | 800 | 0.4 | 0.5 |
| 10 | B-1 | 100 | C-45 | 35 | ECA | 380 | 400 | 0.5 | 0.4 |

Note: Solvent type
ECA: ethyl cellosolve acetate
EL: ethyl lactate
PGMEA: propylene glycol monoethyl ether acetate
MMP: methyl 3-methoxypropionate The resist composition was examined for heat resistance by heating each resist pattern of Examples 1 to 10 on a hot plate at 130° C. for 5 minutes. The resist pattern was observed under an electron microscope to see whether or not the shape of the 5-$\mu$m line-and-space pattern was maintained after heating. All the resist patterns remained unchanged in geometry.

Using a vacuum evaporation chamber model EVD-500 (manufactured by Nichiden Aneruba K.K.), gold (Au) was deposited on each of the resist patterns formed in Examples 1–10 to a thickness of 5,000 Å. The structure was immersed in acetone solvent for 15 minutes and the resist film was stripped off. There was left a gold pattern which was visually observed for resist residues and gold fins under an electron microscope. All the samples were free of resist residues and gold fins. A similar test was carried out using tantalum (Ta), finding that all the tantalum patterns were free of resist residues and fins.

Comparative Examples 1–5

A positive resist composition in solution form was prepared by adding a dissolution promoter and solvent to 100 parts of a novolak resin having a 1,2-naphthoquinone-2-diazidosulfonyl group partially introduced therein as shown in Table 4, further adding 0.3% based on the solvent of a fluorinated surfactant, Fluorinate FC430 (Sumitomo 3M K.K.) thereto, mixing them to form a homogeneous solution, and passing the solution through a 0.2-$\mu$m membrane filter.

The dissolution promoters C-46 and C-47 used in Comparative Examples 1 and 5, respectively, have the following structural formulae.

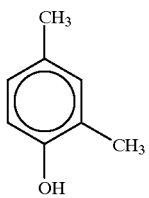

(C-46)

-continued

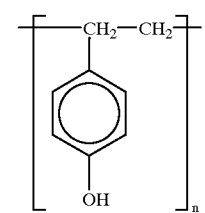

(C-47)

Mw = 3,500
($n$ is a number satisfying Mw = 3,500.)

The resist solution was spin coated onto a 6-inch silicon wafer and softly baked on a hot plate at 90° C. for 90 seconds to form a resist film of 1.5 $\mu$m thick. The resist film was then exposed to radiation (i-line) at wavelength 365 nm through a reticle, subjected to PEB at 110° C. for 90 seconds, and thereafter developed, rinsed with pure water, and dried as above.

The resulting resist was evaluated for various properties by the above-mentioned tests. A profile of 5-μm line-and-space pattern was evaluated in terms of cut dimensions (height A and depth B) of an undercut as shown in FIGS. 1 and 2. The resists of Comparative Examples 1 to 5 were unsatisfactory. No undercuts developed in Comparative Example 5. The pattern flowed away and the resist film dissolved in Comparative Examples 1 and 2. The resin was insoluble in the resist solvent in Comparative Example 3. Resolution was impossible in Comparative Example 4.

space pattern was evaluated in terms of cut dimensions (height A and depth B) of an undercut as shown in FIGS. 1 and 2. The optimum exposure (Eop) was 100 mJ/cm$^2$ and the undercut had A=0.3 μm and B=1.0 μm.

The resist composition was examined for heat resistance by heating the resist pattern of Comparative Example 6 on a hot plate at 130° C. for 5 minutes. The resist pattern was observed under an electron microscope to see whether or not the shape of the 5-μm line-and-space pattern was maintained

TABLE 4

| Comparative Example | NQD-introduced novolak resin | | Dissolution promoter | | Solvent | | Eop (mJ/cm$^2$) | Cut dimensions | |
|---|---|---|---|---|---|---|---|---|---|
| | Type | Amount (pbw) | Type | Amount (pbw) | Type | Amount (pbw) | | A (μm) | B (μm) |
| 1 | B-1 | 100 | C-46 | 30 | ECA | 380 | — | — | — |
| 2 | B-8 | 100 | C-29 | 25 | ECA | 380 | — | — | — |
| 3 | B-9 | 100 | C-29 | 30 | ECA | 360 | — | — | — |
| 4 | B-10 | 100 | C-29 | 30 | ECA | 380 | — | — | — |
| 5 | B-1 | 100 | C-47 | 30 | ECA | 380 | 250 | 0 | 0 |

The resist composition was examined for heat resistance by heating the resist pattern of Comparative Example 5 on a hot plate at 130° C. for 5 minutes. The resist pattern was observed under an electron microscope to see whether or not the shape of the 5-μm line-and-space pattern was maintained after heating. The resist pattern remained unchanged in geometry.

Using a vacuum evaporation chamber model EVD-500, gold (Au) was deposited on the resist pattern formed in Comparative Example 5 to a thickness of 5,000 Å. The structure was immersed in acetone solvent for 15 minutes and the resist film was stripped off. The results are shown in Table 5. The results are unsatisfactory in that some resist film samples could not be stripped off while the remaining resist film samples could be stripped off, but resist residues were left.

TABLE 5

| Comparative Example (evaporation) | Comparative Example (patterning) | Resist stripping | Resist residue | Gold pattern fins |
|---|---|---|---|---|
| 5 | 4 | OK | found | found |

Comparative Example 6

A positive resist composition in solution form was prepared by adding 35 parts of dissolution promoter C-1, 25 parts of photosensitive agent D-1 (synthesized in Synthesis Example 16), and 380 parts of ECA solvent to 100 parts of novolak resin A-1, further adding 0.3% based on the solvent of a fluorinated surfactant, Fluorinate FC430 (Sumitomo 3M K.K.) thereto, mixing them to form a homogeneous solution, and passing the solution through a 0.2-μm membrane filter.

The resist solution was spin coated onto a 6-inch silicon wafer and softly baked on a hot plate at 90° C. for 90 seconds to form a resist film of 1.5 μm thick. The resist film was then exposed to radiation (i-line) at wavelength 365 nm through a reticle, subjected to PEB at 110° C. for 90 seconds, and thereafter developed, rinsed with pure water, and dried as above.

The resulting resist was evaluated for various properties by the above-mentioned tests. A profile of 5-μm line-andafter heating. The resist pattern sagged down to the substrate at the edge where it was undercut.

Using a vacuum evaporation chamber model EVD-500, gold (Au) was deposited on the resist pattern formed in Comparative Example 6 to a thickness of 5,000 Å. The structure was immersed in acetone solvent for 15 minutes and the resist film was stripped off. There was left a gold pattern which was visually observed for resist residues and gold fins under an electron microscope. The sample was free of resist residues and gold fins.

Tantalum (Ta) was deposited on the resist pattern formed in Comparative Example 6 to a thickness of 5,000 Å, followed by immersion in acetone solvent and stripping-off of the resist film. An observation of the resulting tantalum pattern under an electron microscope revealed that stripping of the resist was unsatisfactory.

Japanese Patent Application No. 26217/1996 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

What is claimed is:

1. A method for forming a pattern comprising the steps of:

forming a resist layer on one surface of a substrate wherein said resist layer is constructed of a positive resist composition for use in a lift-off technique comprising in admixture,
    (A) a 1,2-naphthoquinonediazidosulfonyl-introduced novolak resin containing at least one recurring unit of the following general formula (1):

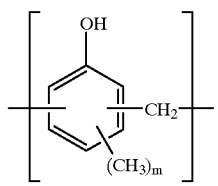

(1)

wherein m is an integer of 0 to 3, and having a weight average molecular weight calculated as polystyrene of 2,000 to 20,000, 2.5 to 27 mol % of the hydrogen atom of a hydroxyl group in the novolak resin being replaced by a 1,2-naphthoquinonediazidosulfonyl group, and (B) a low molecular aromatic compound having phenolic hydroxyl groups and 2 to 20 benzene rings, the ratio of the number of phenolic hydroxyl groups to the number of benzene rings being from 0.5 to 2.5, said low molecular aromatic compound being represented by the following general formula (2) or (3):

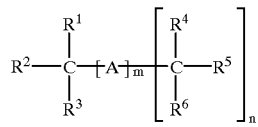

(2)

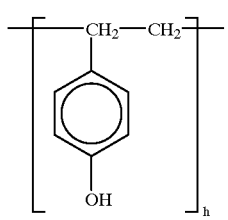

(3)

wherein m is an integer of 0 to 2, n is an integer of 0 to 2, with the proviso that m is equal to 1 or 2 when n is equal to 0, $R^1$ to $R^6$ are independently selected from the class consisting of a hydrogen atom, a methyl group, a group of the following formula (4), and a group of the following formula (5), A is hydrogen, methyl or a group of the following formula (4) when n is 0 and m is 1; one A is methylene or a group of the following formula (6) and the other A is hydrogen, methyl or a group of the following formula (4) when n is 0 and m is 2; A is methylene or a group of the following formula (6) when n is 1; A is methine or a group of the following formula (7) when n is 2 and m is 1; and one A is methylene or a group of the following formula (6) and the other A is methine or a group of the following formula (7) when n is 2 and m is 2, h is a sufficient number to give a weight average molecular weight of 200 to 2,500,

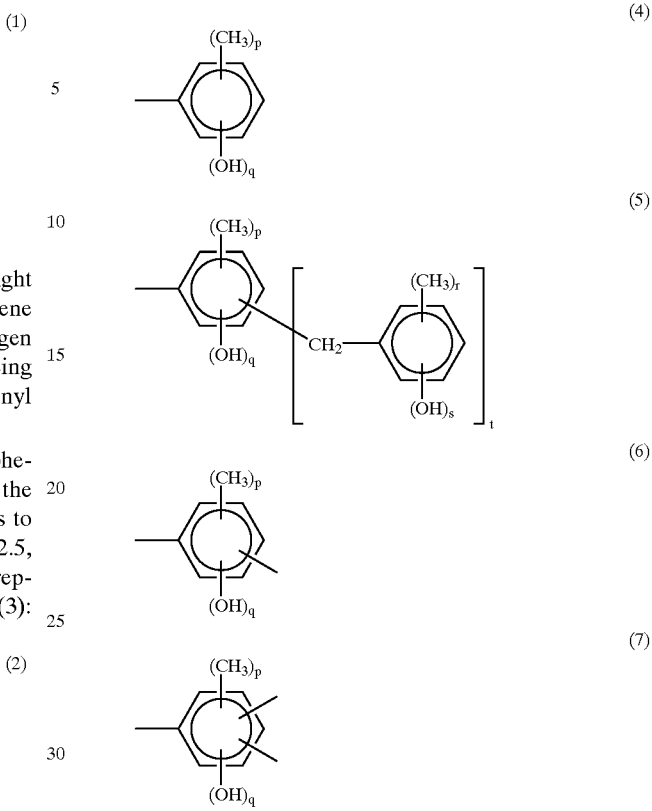

wherein p, q, r, s, and t each are an integer of 0 to 3, processing the resist layer to form a resist pattern, metallizing the substrate surface including the resist pattern, and stripping off the resist pattern to leave a pattern of metallization on the substrate, wherein said resist layer constituting said resist pattern is formed with an undercut.

2. The pattern forming method of claim 1 wherein in a profile of said resist layer has a line width of L μm and a thickness of T μm, and the undercut has a cut height of A μm and a cut depth of B μm, the resist layer has a thickness T of up to 20 μm and the undercut has an extent of cut defined by the equations (I) and (II):

$$1/20 \leq A/T \leq 2/5 \quad \text{(I)}$$

$$1/20 \leq A/B \leq 4 \quad \text{(II)}.$$

3. The pattern forming method of claim 2 wherein the steps of forming a resist layer on one surface of a substrate and processing the resist layer to form a resist pattern include forming a resist layer on one surface of a substrate from a positive resist composition for use in a lift-off technique comprising in admixture, (A) a 1,2-naphthoquinonediazidosulfonyl-introduces novolak resin containing at least one recurring unit of the following general formula (1):

(1)

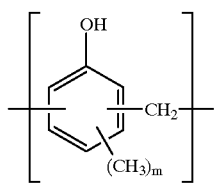

wherein m is an integer of 0 to 3, and having a weight average molecular weight calculated as polystyrene of 2,000 to 20,000, 2.5 to 27 mol % of the hydrogen atom of a hydroxyl group in the novolak resin being replaced by a 1,2-naphthoquinonediazidosulfonyl group, and (B) a low molecular aromatic compound having phenolic hydroxyl groups and 2 to 20 benzene rings, the ratio of the number of phenolic hydoxyl groups to the number of benzene rings being from 0.5 to 2.5, said low molecular aromatic compound being represented by the following general formula (2) or (3):

(2)

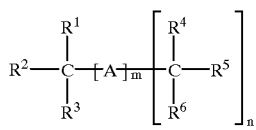

(3)

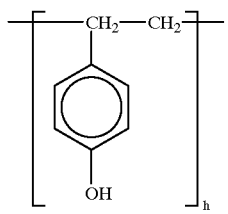

wherein m is an integer of 0 to 2, n is an integer of 0 to 2, with the proviso that m is equal to 1 or 2 when n is equal to 0, $R^1$ to $R^6$ are independently selected from the class consisting of a hydrogen atom, a methyl group, a group of the following formula (4), and a group of the following formula (5), A is hydrogen, methyl or a group of the following formula (4) when n is 0 and m is 1 ; one A is methylene or a group of the following formula (6) and the other A is hydrogen, methyl or a group of the following formula (4) when n is 0 and m is 2; A is methylene or a group of the following formula (6) when n is 1; A is methine or a group of the following formula (7) when n is 2 and m is 1; and one A is methylene or a group of the following formula (6) and the other A is methine or a group of the following formula (7) when n is 2 and m is 2, h is a sufficient number to give a weight average molecular weight of 200 to 2,500,

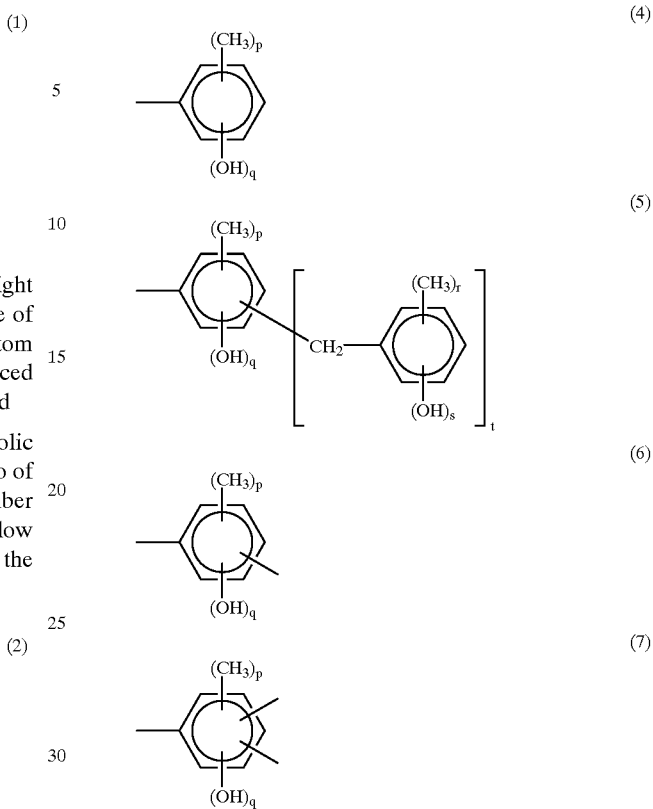

wherein p,q,r,s, and t each are an integer of 0 to 3, baking the resist layer at a temperature of 90 to 130° C. before exposure or before development, exposing the resist layer to light, developing the resist layer, thereby forming an undercut in the resist layer.

4. The pattern forming method of claim 3, wherein the baking of the resist layer is at a temperature of 100 to 120° C.

5. The pattern forming method of claim 3, wherein developing includes application of an aqueous solution of an organic base and an inorganic base.

6. The pattern forming method of claim 5, wherein the organic base is tetramethylammonium hydroxide and the inorganic base is sodium hydroxide, potassium hydroxide, or potassium metaborate.

7. The pattern forming method of claim 2, wherein the undercut has the extent of cut defined by equations (I) and (II) of:

$$1/10 \leq A/T \leq 1/5 \qquad \text{I.}$$

$$1/5 \leq A/B \leq 1 \qquad \text{II.}$$

8. The pattern forming method of claim 1 wherein the steps of forming a resist layer on one surface of a substrate and processing the resist layer to form a resist pattern include forming a resist layer on one surface of a substrate from a positive resist composition, for use in a lift-off technique comprising in mixture, (A) a 1,2-naphthoquinonediazidosulfonyl-introduced novolak resin containing at least one recurring unit of the following general formula (1):

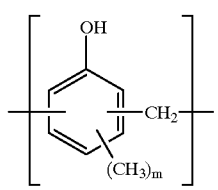
(1)

wherein m is an integer of 0 to 3, and having a weight average molecular weight calculated as polystyrene of 2,000 to 20,000, 2.5 to 27 mol % of the hydrogen atom of a hydroxyl group in the novolak resin replaced by a 1,2-naphthoquinonediazidosulfonyl group, and (B) a low molecular aromatic compound having phenolic hydroxyl groups and 2 to 20 benzene rings, the ratio of the number of phenolic hydroxyl groups to the number of benzene rings being from 0.5 to 2.5, said low molecular aromatic compound being represented by the following general formula (2) or (3):

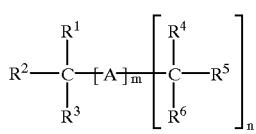
(2)

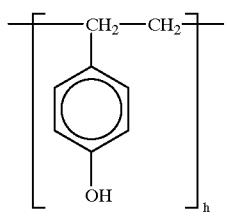
(3)

wherein m is an integer of 0 to 2, n is an integer of 0 to 2, with the proviso that m is equal to 1 or 2 when n is equal to 0, $R^1$ to $R^6$ are independently selected from the class consisting of a hydrogen atom, a methyl group, a group of the following formula (4), and a group of the following formula (5), A is hydrogen, methyl or a group of the following formula (4) when n is 0 and m is 1; one A is methylene or a group of the following formula (6) and the other A is hydrogen, methyl or a group of the following formula (4) when n is 0 and m is 2; A is methylene or a group of the following formula (6) when n is 1; A is methine or a group of the following formula (7) when n is 2 and m is 1; and one A is methylene or a group of the following formula (6) and the other A is methine or a group of the following formula (7) when n is 2 and m is 2, h is a sufficient number to give a weight average molecular weight of 200 to 2,500,

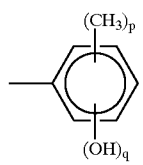
(4)

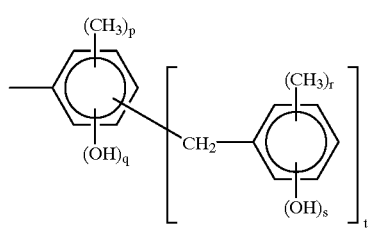
(5)

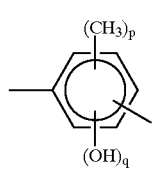
(6)

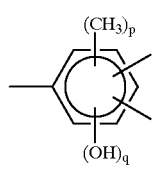
(7)

wherein p,q,r,s, and t each are an integer of 0 to 3, baking the resist layer at a temperature of 90 to 130° C. before exposure or before development, exposing the resist layer to light, developing the resist layer, thereby forming an undercut in the resist layer.

9. The pattern forming method of claim 8, wherein the baking of the resist layer is at a temperature of 100 to 120° C.

10. The pattern forming method of claim 8, wherein developing includes application of an aqueous solution of an organic base and an inorganic base.

11. The pattern forming method of claim 10, wherein the organic base is tetramethylammonium hydroxide and the inorganic base is sodium hydroxide, potassium hydroxide, or potassium metaborate.

12. The pattern forming of claim 8 wherein in a profile of said resist layer has a line width of L μm and a thickness of T μm, and the undercut has a cut height of A μm and a cut depth of B μm, the resist layer has a thickness T of up to 20 μm and the undercut has an extent of cut defined by the equations (I) and (II):

$$1/20 \leq A/T \leq 2/5 \qquad (I)$$

$$1/20 \leq A/B \leq 4 \qquad (II).$$

13. The pattern forming method of claim 1 wherein the novolak resin having a weight average molecular weight calculated as polystyrene of 3,000–10,000.

14. The pattern forming method of claim 1 wherein 3 to 20 mol % of the hydrogen atom of a hyroxyl group in the novolak resin being replaced by a 1,2-naphthoquinonediazidosulfonyl group.

15. The pattern forming method of claim 1 wherein the low molecular aromatic compound has 3 to 10 benzene rings.

16. The pattern forming method of claim 1 wherein the low molecular aromatic compound has a weight average molecular weight of 200–2,500.

17. The pattern forming method of claim 1 wherein the low molecular aromatic compound has a weight average molecular weight of 300–2,000.

18. The pattern forming method of claim 1 wherein the ratio of the number of phenolic hydroxyl groups to the number of benzene rings is from 0.7–2.0.

19. The pattern forming method of claim 1 wherein the positive resist composition further comprises at least one dye, pigment, surfactant, photosensitive agent, or combinations thereof.

20. The pattern forming method of claim 1 wherein metallizing the substrate surface forms a layer of gold or tantalum.

* * * * *